United States Patent
Hikita et al.

(10) Patent No.: US 6,965,166 B2
(45) Date of Patent: Nov. 15, 2005

(54) SEMICONDUCTOR DEVICE OF CHIP-ON-CHIP STRUCTURE

(75) Inventors: Junichi Hikita, Kyoto (JP); Yoshikazu Nakagawa, Kyoto (JP); Koji Yamamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/373,692

(22) Filed: Feb. 27, 2003

(65) Prior Publication Data

US 2003/0146518 A1 Aug. 7, 2003

Related U.S. Application Data

(63) Continuation of application No. 09/571,105, filed on Feb. 23, 2000, now abandoned.

(30) Foreign Application Priority Data

| Feb. 24, 1999 | (JP) | ............................................ | 11-046853 |
| Feb. 26, 1999 | (JP) | ............................................ | 11-051210 |

(51) Int. Cl.[7] .............................................. H01L 23/48
(52) U.S. Cl. ...................................... 257/777; 257/778
(58) Field of Search ................................ 257/777, 778

(56) References Cited

U.S. PATENT DOCUMENTS

| 4,565,314 A |   | 1/1986 | Scholz |  |
|---|---|---|---|---|
| 5,757,999 A |   | 5/1998 | Tabuchi et al. |  |
| 5,904,544 A | * | 5/1999 | Zommer | ...................... 438/454 |
| 6,046,910 A | * | 4/2000 | Ghaem et al. | ............... 361/760 |
| 6,133,637 A |   | 10/2000 | Hikita et al. |  |
| 6,225,699 B1 | * | 5/2001 | Ference et al. | .............. 257/777 |
| 6,229,319 B1 | * | 5/2001 | Johnson | ....................... 324/751 |
| 6,236,109 B1 | * | 5/2001 | Hsuan et al. | ................ 257/688 |
| 6,265,775 B1 | * | 7/2001 | Seyyedy | ...................... 257/737 |
| 6,271,110 B1 | * | 8/2001 | Yamaguchi et al. | ......... 438/613 |

FOREIGN PATENT DOCUMENTS

| GB | 2 274 201 | 7/1994 |
| GB | 6 283 663 | 10/1994 |
| JP | 60 76189 | 4/1985 |
| JP | 5-167004 | 7/1993 |
| JP | 5-343605 | 12/1993 |
| JP | 06112402 | 4/1994 |
| JP | 08222571 | 8/1996 |
| JP | 8-340001 | 12/1996 |
| JP | 9 80273 | 3/1997 |
| JP | 11-312700 | 11/1999 |
| JP | 11-330120 | 11/1999 |

* cited by examiner

*Primary Examiner*—Amir Zarabian
*Assistant Examiner*—Kiesha Rose
(74) *Attorney, Agent, or Firm*—Rabin & Berdo, P.C.

(57) ABSTRACT

A semiconductor device including a first semiconductor chip, a second semiconductor chip bonded to the first semiconductor chip in a stacked relation, and a registration structure which causes the first and second semiconductor chips to be positioned with respect to each other by depression-projection engagement therebetween. The registration structure includes, for example, a registration recess provided on a surface of the first semiconductor chip, and a registration projection provided on a surface of the second semiconductor chip for engagement with the registration recess. The registration projection may be a spherical member provided on the surface of the second semiconductor chip.

16 Claims, 12 Drawing Sheets

SEMICONDUCTOR DEVICE OF CHIP-ON-CHIP STRUCTURE

This is a continuation of U.S. Ser. No. 09/511,105 filed Feb. 23, 2000, which is now abandoned.

BACKGROUND OF THE INVENTION

1. Field of the Invention

The present invention relates to semiconductor devices of chip-on-chip structure. The invention further relates to a semiconductor chip to be bonded to a surface of a solid body (e.g., semiconductor chip or wiring board). The invention still further relates to an assembling process for a semiconductor device of chip-on-chip structure.

2. Description of Related Art

For substantial increase in integration level, attention has been directed to semiconductor devices of chip-on-chip structure in which semiconductor chips are arranged in a double-stacked relation.

In such a semiconductor device, more specifically, the semiconductor chips to be stacked each have pad openings formed in a device formation surface thereof to partly expose internal interconnections. Electrode projections called "bumps" are respectively provided on the pad openings. These semiconductor chips are stacked in a face-to-face relation.

One of the semiconductor chips, for example, has a larger size than the other semiconductor chip, and serves as a mother chip or primary chip which has electrodes for external connection. For example, the electrodes are provided on the device formation surface of the primary chip. The electrodes of the primary chip are electrically connected to electrodes on an underlying substrate (wiring board), and external connection electrodes are provided on the underlying substrate. For mounting of the semiconductor device, the external connection electrodes of the underlying substrate are connected to a printed board or a ceramic board by soldering.

In the case of the semiconductor device of chip-on-chip structure, it is important to properly position the semiconductor chips with respect to each other. Improper positioning often makes it impossible to bond the corresponding bumps of the two semiconductor chips to each other.

Conventionally, the positioning accuracy is determined by the accuracy of mechanical alignment of the substrates on which the semiconductor chips are respectively mounted. However, there is a possibility that misalignment of the semiconductor chips occurs due to erroneous recognition by a machine.

One possible approach to this problem is to detect exact alignment of the bumps by detecting coincidence of images of the bumps formed through total reflection by optical prisms when the two semiconductor chips are stacked. However, this optical approach requires much time and labor, making it difficult to improve the productivity.

SUMMARY OF THE INVENTION

It is an object of the present invention to provide a semiconductor device which has a construction that allows for efficient positioning of semiconductor chips in a staked relation thereby to improve the productivity.

It is another object of the invention to provide a semiconductor chip which is constructed so as to be positioned with respect to a solid surface at a higher level of accuracy.

It is further another object of the invention to provide an assembling process for a semiconductor device, which allows for efficient positioning of semiconductor chips with respect to each other thereby to improve the productivity of the semiconductor device.

The semiconductor device according to the present invention comprises a first semiconductor chip, a second semiconductor chip bonded to the first semiconductor chip in a stacked relation, and a registration structure which permits the first and second semiconductor chips to be positioned with respect to each other by depression-projection engagement therebetween.

With this arrangement, the first and second semiconductor chips are brought into depression-projection engagement so as to be properly positioned with respect to each other when the semiconductor chips are stacked to form a chip-on-chip structure. This ensures reliable bonding of bumps for electrical connection, thereby improving the production yield.

The registration structure may include a registration recess provided on a surface of the first semiconductor chip opposed to the second semiconductor chip, and a registration projection provided on a surface of the second semiconductor chip opposed to the first semiconductor chip for engagement with the registration recess.

The registration projection may be a spherical member provided on the surface of the second semiconductor chip. In this case, the spherical member preferably has a radius such that a distance between a center thereof and the surface of the second semiconductor chip is greater than a height of a bump on the second semiconductor chip as measured from the surface of the second semiconductor chip. This is advantageous because, when the semiconductor chips are stacked, the spherical member is brought into engagement with the recess for the positioning before the bumps on the first and second semiconductor chips are bonded to each other. Further, a shock applied to the bumps can be alleviated by the engagement between the spherical member and the recess at the bonding. In addition, the spherical member serves to absorb stresses exerted on the semiconductor chips after the bonding.

The recess may be a pad provided on the first semiconductor chip. In this case, formation of the recess can be achieved simultaneously with formation of an electrode pad in the same step.

The recess may be a recess formed in a semiconductor substrate which serves as abase of the first semiconductor chip, or a recess formed in an insulating film provided on the semiconductor substrate.

The registration recess may be formed in a first bump provided on the surface of the first semiconductor chip, and the registration projection may be a second bump provided on the surface of the second semiconductor chip. In this case, it is preferred that the first bump and the second bump respectively have mating surfaces to be bonded to each other and the mating surfaces of the first and second bumps have different areas.

With this arrangement, one of the bumps having a smaller mating surface mates with any surface portion of the other bump having a greater mating surface, so that a mechanical positioning offset occurring when the semiconductor chips are stacked can be accommodated.

The registration structure may comprise a first registration recess provided on the surface of the first semiconductor chip opposed to the second semiconductor chip, a second registration recess provided on the surface of the second semiconductor chip opposed to the first semiconductor chip, and a spherical member held between the first and second registration recesses.

With this arrangement, the first and second recesses can be registered with respect to each other by the spherical member when the semiconductor chips are stacked to form the chip-on-chip structure. This ensures reliable bonding between the bumps, thereby improving the production yield.

The spherical member preferably has a radius such that a center thereof is located at a higher level than a top surface of the bump when the spherical member is placed in the first or second registration recess before assembling.

Thus, when the semiconductor chips are stacked, the recesses are guided by the spherical member for the registration thereof before the bumps on the semiconductor chips are bonded to each other. Further, the spherical member abuts against the recesses at the bonding, so that a shock applied to the bumps can be alleviated. In addition, the spherical member serves to absorb stresses exerted on the semiconductor chips during use of the semiconductor device after the bonding.

Either of the first and second semiconductor chips may have a peripheral bump surrounding a device formation region thereof. The peripheral bump may be formed with a groove as the registration recess. In this case, stresses exerted on the semiconductor chips are absorbed by the peripheral bump. Further, the peripheral bump can be used as an electrode interconnection on the device formation surface of the semiconductor chip. Thus, the bump can be used in place of a part of the chip internal interconnection, allowing for further integration in device formation.

The semiconductor chip according to the present invention comprises a projection or a recess provided on a surface thereof for positioning thereof with respect to a surface of a solid body. The projection may be a spherical member. In this case, the spherical member preferably has a radius such that a distance between a center thereof and the surface of the semiconductor chip is greater than a height of a bump provided on the semiconductor chip as measured from the surface of the semiconductor chip. The recess or the projection may be provided on a mating surface of a bump for electrical connection to the solid body.

The semiconductor device assembling process according to the present invention comprises the steps of: forming a registration recess on a surface of a first semiconductor chip; forming a registration recess on a surface of a second semiconductor chip; placing a spherical member on the registration recess of the first semiconductor chip; stacking the first and second semiconductor chips with the spherical member being held between the registration recesses of the first and second semiconductor chips; and bonding the stacked first and second semiconductor chips to each other.

The bonding step preferably comprises the step of pressing the first and second semiconductor chips against each other to crush the spherical member.

The foregoing and other objects, features and effects of the present invention will become more apparent from the following description of the preferred embodiments with reference to the attached drawings.

DESCRIPTION OF THE PREFERRED EMBODIMENTS

Although description will hereinafter be made on the premise that semiconductor chips are Si-based, any other semiconductors such as GaAs and Ge may be employed.

Figure 1:
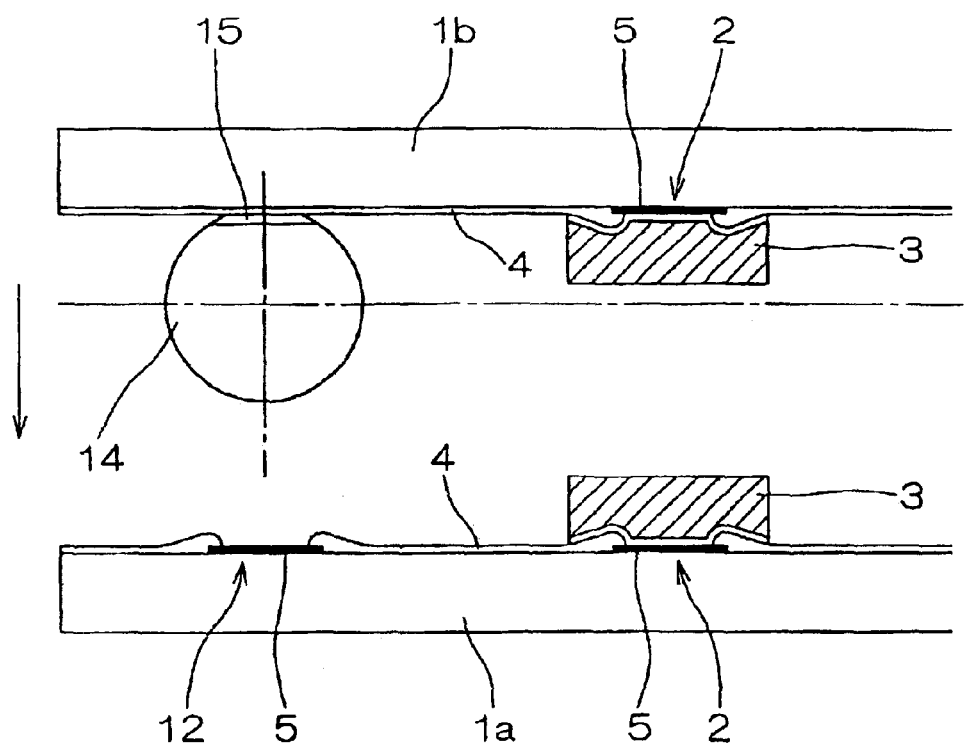
FIG. 1 is a sectional view for explaining the construction of a semiconductor device according to a first embodiment of the present invention.

FIG. 1 is a diagram for explaining the construction of a semiconductor device according to a first embodiment of the present invention, and illustrates sections of semiconductor chips 1a, 1b to be stacked. One 1a of the semiconductor chips has a pad 12 (an exposed portion of an internal interconnection 5) provided at a predetermined position in a peripheral portion thereof surrounding a device formation region on an active surface side thereof, for example, in a scribe line region thereof. The pad 12 functions as a registration recess. A bump 3 for ordinary electrical connection is provided on a pad 2 (an exposed portion of an internal interconnection 5) in the device formation region of the semiconductor chip 1b.

The other semiconductor chip 1b has a bump 3 provided on a pad 2 in a device formation region on an active surface side thereof, and a metal ball 14 bonded to a surface portion thereof corresponding to the position of the pad 12 of the semiconductor chip 1a. The metal ball 14 functions as a registration projection.

The metal ball 14 is dimensioned so that a distance between the center thereof and the surface of the semiconductor chip 1b is greater than a height of the bump 3 as measured from the surface of the semiconductor chip 1b when the metal ball 14 is bonded to the semiconductor chip 1b. In practice, the size of the metal ball 14 is not limited, but the metal ball 14 may have, for example, a diameter of about 100 ìm.

The metal ball 14 is preferably composed of a soft metal such as solder, Au or Sn. The bonding of the metal ball 14 is achieved, for example, by forming a metal film 15 such as of Cu, Au or a TiW alloy at a predetermined position of the semiconductor chip 1b, then placing the metal ball 14 on the metal film by means of a special tool, and fuse-bonding the metal ball by heat or ultrasonic wave.

Figure 2A:
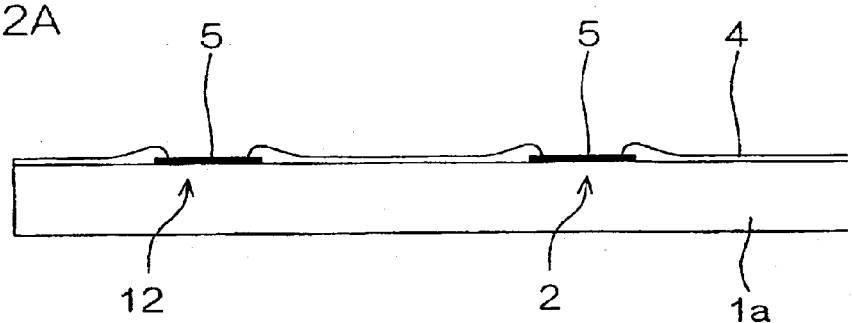
FIGS. 2A to 2D are diagrams for explaining a process for forming a bump.

A brief explanation will be given to a process for forming the bump 3 on the device formation surface of the semiconductor chip 1a. Referring to FIG. 2A, Al pad electrodes 5 are provided in predetermined positions on a semiconductor substrate which serves as a base of the semiconductor chip 1a, and a passivation film 4 such as of SiN, SiON, $SiO_2$ or PSG is formed over the semiconductor substrate (except electrode portions). The formation of the passivation film 4 is achieved, for example, by plasma CVD.

Figure 2B:
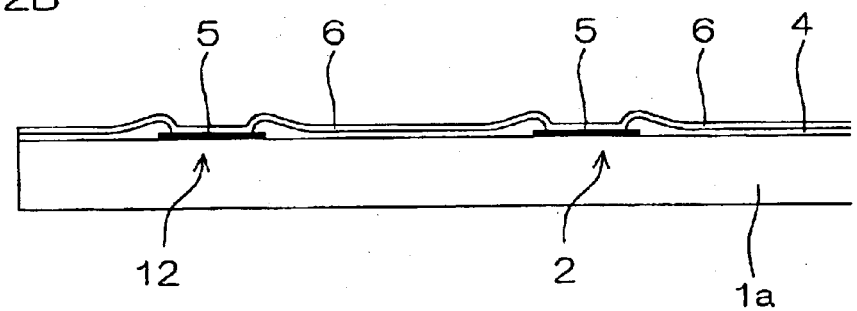

As shown in FIG. 2B, a TiW alloy layer (barrier metal layer not shown) for improving adhesion to the underlying layer and a seed layer 6 such as of Au or Pt for plating are successively formed over the entire surface of the resulting substrate by vapor deposition such as sputtering.

Figure 2C:
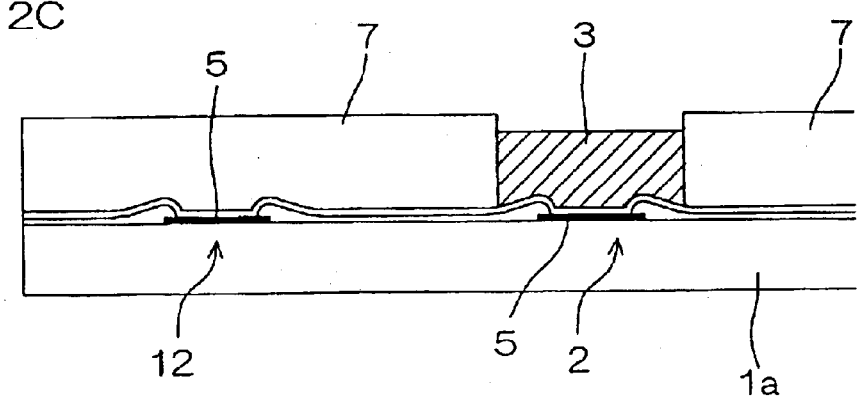

A photoresist 7 is applied on the resulting surface except a portion thereof on which the bump is to be formed by plating, and then a metal bump material is thickly deposited on the portion of the resulting surface by an electroplating method (FIG. 2C). Examples of the metal bump material include oxidation-resistant metals such as Au, Pd, Pt, Ag and Ir (iridium). Instead of the electroplating method, an electroless plating method may be employed which is a metal film formation method utilizing a reducing action by a chemical reaction.

Figure 2D:
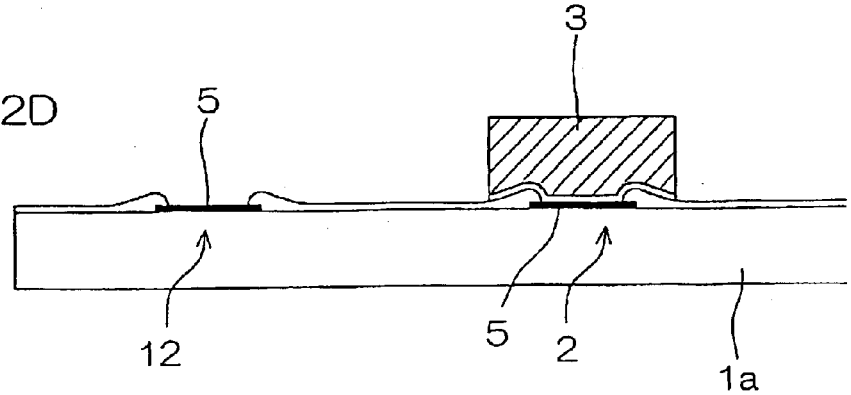

In turn, the photoresist 7 is removed, and the seed layer 6 and the barrier metal layer on the resulting surface are removed. Then, the resulting surface is subjected to an annealing process. Thus, the semiconductor chip formed with the bump 3 is provided. The electrode 5 on the pad 12 shown in the left-hand part of FIG. 2D remains exposed.

Figure 3:
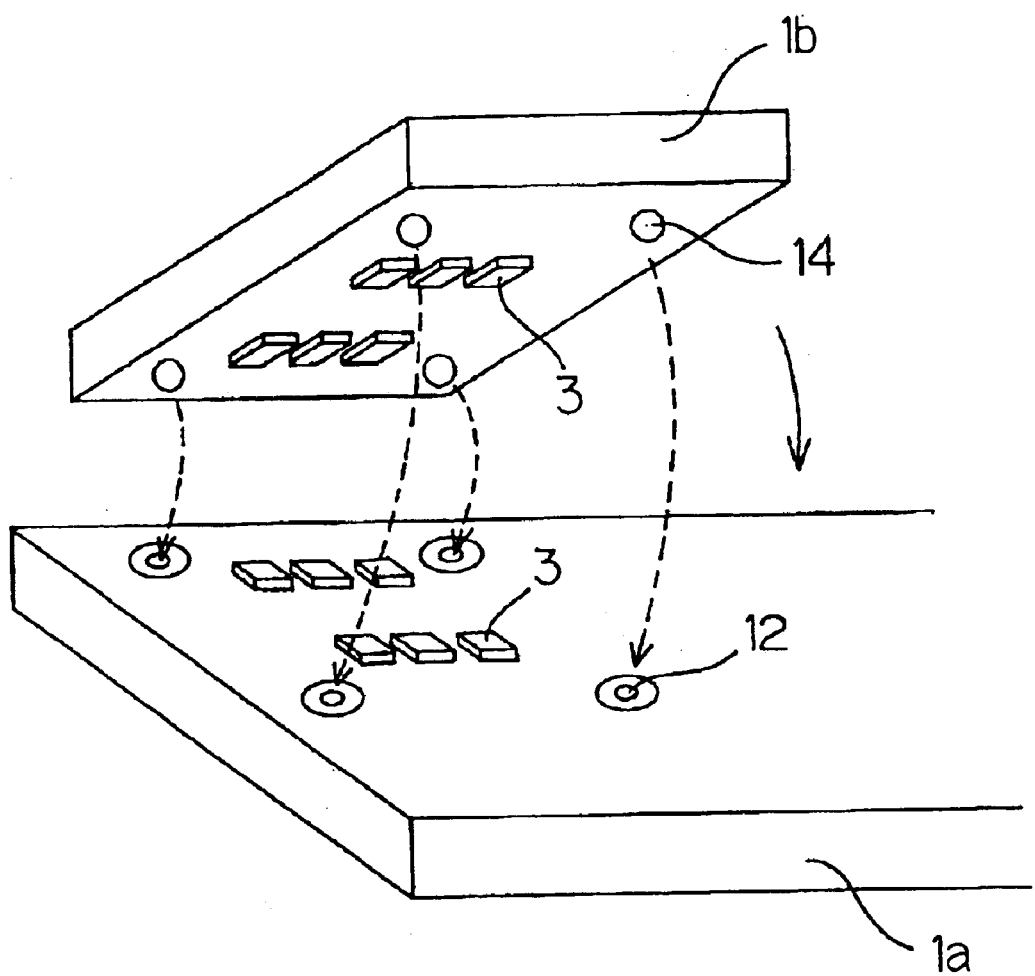
FIG. 3 is a perspective view illustrating a state where semiconductor chips are to be stacked.

FIG. 3 is a perspective view illustrating a state where the semiconductor chip 1b formed with metal balls 14 is to be stacked onto the semiconductor chip 1a.

In this perspective view, four metal balls 14 are provided in four corners of the semiconductor chip 1b, and four pads 12 corresponding to the metal balls 14 are provided on the semiconductor chip 1a. It is noted that the numbers of the metal balls 14 and the pads 12 are not limited to four, but any numbers of metal balls 14 and pads 12 may be employed as long as the semiconductor chips 1a and 1b can accurately be positioned with respect to each other. However, the positioning with the use of a single ball/pad pair cannot prevent relative rotation of the semiconductor chips 1a and 1b, so that not smaller than two ball/pad pairs are preferably employed.

The metal ball bonding positions are not necessarily located in the peripheral portion of the semiconductor chip 1b, but may be located in a center portion of the semiconductor chip 1b.

When the semiconductor chips 1a, 1b are stacked, the pads 12 are guided by the corresponding metal balls 14 thereby to be located in the same positions as the corresponding metal balls 14 as viewed in plan. Thus, the positioning of the semiconductor chips 1a, 1b with respect to each other can be achieved. In this state, the semiconductor chips 1a, 1b are pressed against each other while being heated, whereby the bumps 3 on the semiconductor chip 1a can assuredly be bonded to the corresponding bumps 3 on the semiconductor chip 1b. At this time, the metal balls 14 are bonded to the corresponding pads 12 by heat and pressure.

The metal balls 14 are deformed by an external force exerted thereto at the bonding of the bumps 3, thereby alleviating a shock applied to the bumps 3. When a semiconductor device of chip-on-chip structure is produced by bonding the semiconductor chips 1a and 1b to each other and packaged in a sealing resin, the metal balls 14 serve to absorb stresses exerted on the joint portions of the semiconductor chips due to warpage of the semiconductor chips.

Figure 4A:
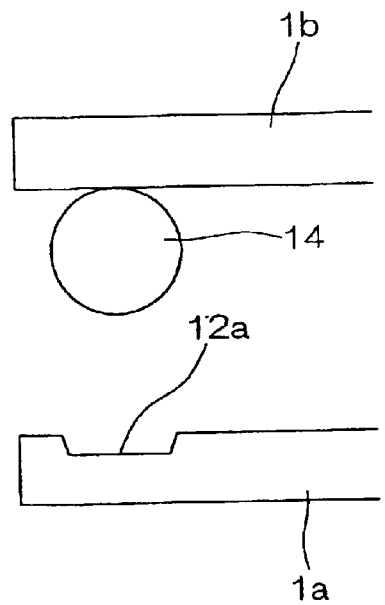
FIGS. 4A and 4B are sectional views each illustrating a recess to be employed instead of a pad.
Figure 4B:
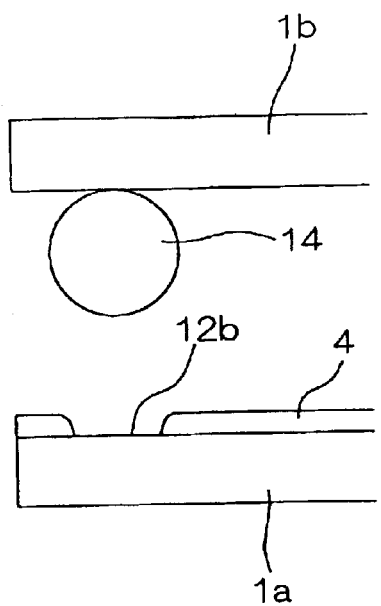

In the first embodiment, the pad 12 is employed as the registration recess, but the recess may be embodied in any other way. For example, as shown in FIG. 4A, a recess 12a may be formed by etching down a surface portion of the semiconductor substrate. Alternatively, an insulating film 4 of a greater thickness is formed on the peripheral surface portion of the chip, as shown in FIG. 4B, for formation of a recess 12b. That is, the recess may be formed in the insulating film 4. Further, the recess 12 may have any shape, for example, a V-shaped cross section or a semicircular cross section.

Besides the metal ball 14, a bump formed by plating, sputtering, vapor deposition or the like may be employed as the registration projection (see Japanese Unexamined Patent Publication No. 8-222571 (1996) for formation of spherical bumps).

Figure 5:
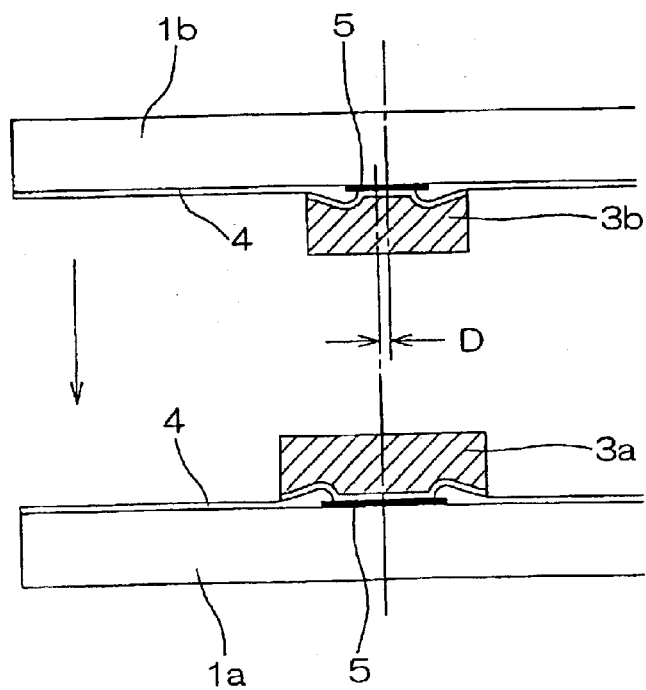
FIG. 5 is a sectional view illustrating the construction of a semiconductor device according to a second embodiment of the invention.

FIG. 5 is a sectional view illustrating the construction of a semiconductor device according to a second embodiment of the invention, in which a bump provided on one of a pair of semiconductor chips to be stacked has a greater plan area than a corresponding bump provided on the other semiconductor chip. In FIG. 5, components corresponding to those illustrated in FIG. 1 are denoted by the same reference characters as in FIG. 1. However, it is not intended that the components denoted by the same reference character necessarily have an identical construction and function.

A bump 3a is provided in a device formation region on an active surface side of one 1a of the semiconductor chips 1a, 1b to be stacked. A bump 3b is provided in a device formation region on an active surface side of the other semiconductor chip 1b. In FIG. 5, the semiconductor chips 1a, 1b are to be stacked with a positional offset D.

The bump 3b has a standard mating surface area as in an ordinary design, but the bump 3a has a greater mating surface area than the standard mating surface area. Therefore, even if the semiconductor chips 1a, 1b are stacked with some positional offset D which is not greater than a difference in radius between the greater mating surface of the bump 3a and the smaller mating surface of the bump 3b, the bump 3a and the bump 3b can properly be connected to each other without reduction in the contact surface area therebetween.

Figure 6A:
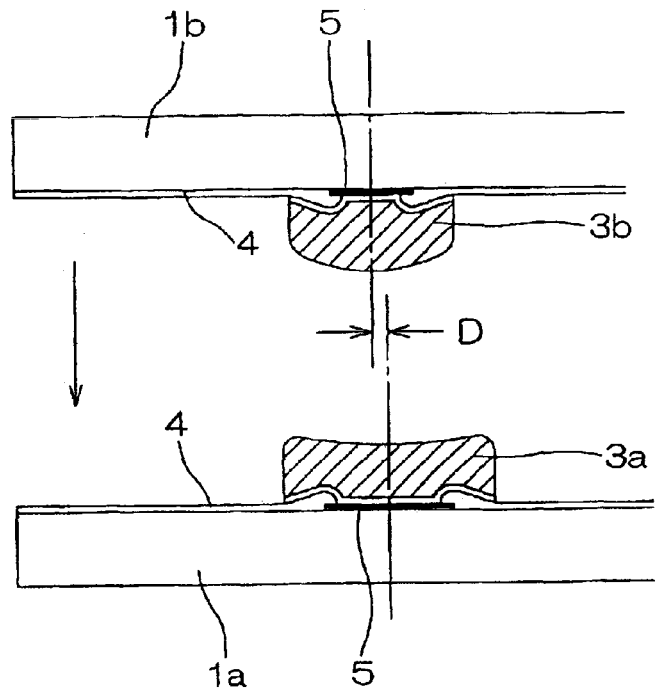
FIG. 6A is a sectional view illustrating one exemplary arrangement for bumps, one of which has a concave mating surface of a greater area and the other of which has a convex mating surface of a smaller area.
Figure 6B:
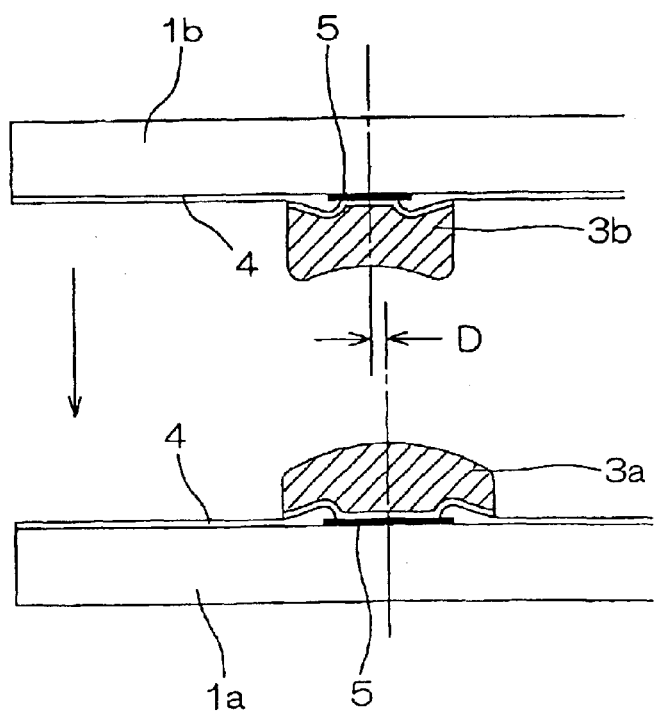
FIG. 6B is a sectional view illustrating another exemplary arrangement for bumps, one of which has a convex mating surface of a greater area and the other of which has a concave mating surface of a smaller area.

FIG. 6A is a diagram illustrating one exemplary arrangement for the bumps in which the bump 3a has a concave mating surface of a greater area and the bump 3b has a convex mating surface of a smaller area (see Japanese Unexamined Patent Publication No. 6-112402 (1994) for a bump having a concave mating surface). FIG. 6B is a diagram illustrating another exemplary arrangement for the bumps in which the bump 3a has a convex mating surface of a greater area and the bump 3b has a concave mating surface of a smaller area.

In accordance with the exemplary arrangements shown in FIGS. 6A and 6B, even if a mechanical positioning error D occurs when the semiconductor chips are stacked, the error D is corrected by the engagement between the concave and convex mating surfaces for accurate positioning of the chips. Even if the error D cannot be corrected, the bumps can be bonded with a sufficient contact surface area because the bump 3a has a greater mating surface area than the bump 3b.

Figure 7A:
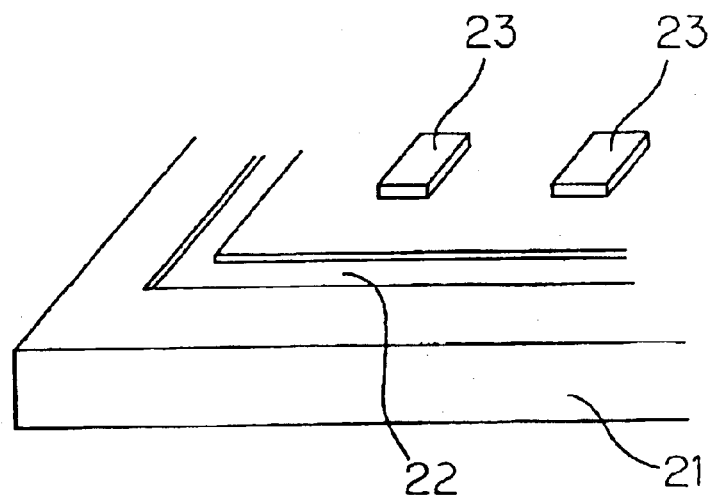
FIGS. 7A and 7B are perspective views illustrating the construction of a major portion of a semiconductor chip employed in a semiconductor device according to a third embodiment of the invention.

FIG. 7A is a perspective view illustrating a major portion of a semiconductor chip 21 according to a third embodiment of the invention. Bumps 23 are provided on a device formation surface of the semiconductor chip 21, and a groove 22 is formed in a predetermined position within a peripheral portion, i.e., a scribe line region of the semiconductor chip 21. The formation of the groove may be achieved by etching a semiconductor substrate of the chip or by cutting the semiconductor substrate by a cutting tool.

Figure 7B:
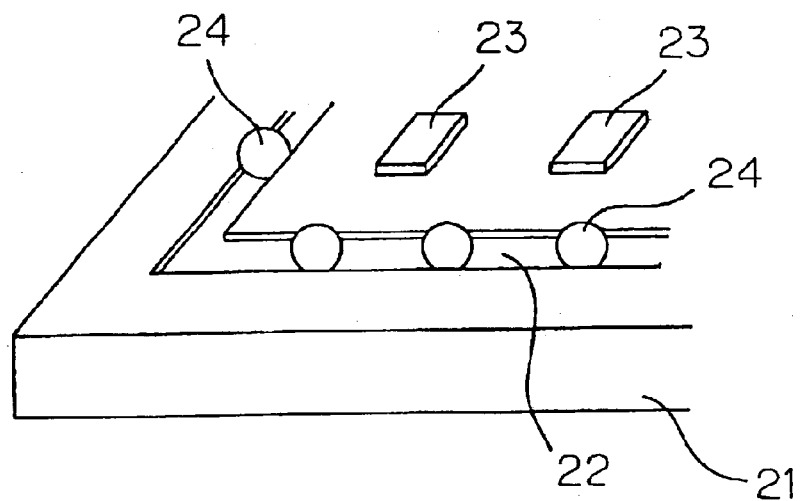

Metal balls 24 are disposed in the groove 22 (see FIG. 7B). The metal balls 24 are composed of a soft metal such as solder, Au or Sn. One possible method for placement of the metal balls 24 is such that an operator places the metal balls 24 one by one in the groove 22 by means of tweezers by observation through a microscope but, a more practical method is such that the metal balls are introduced into the groove 22 by a guide.

Figure 8A:
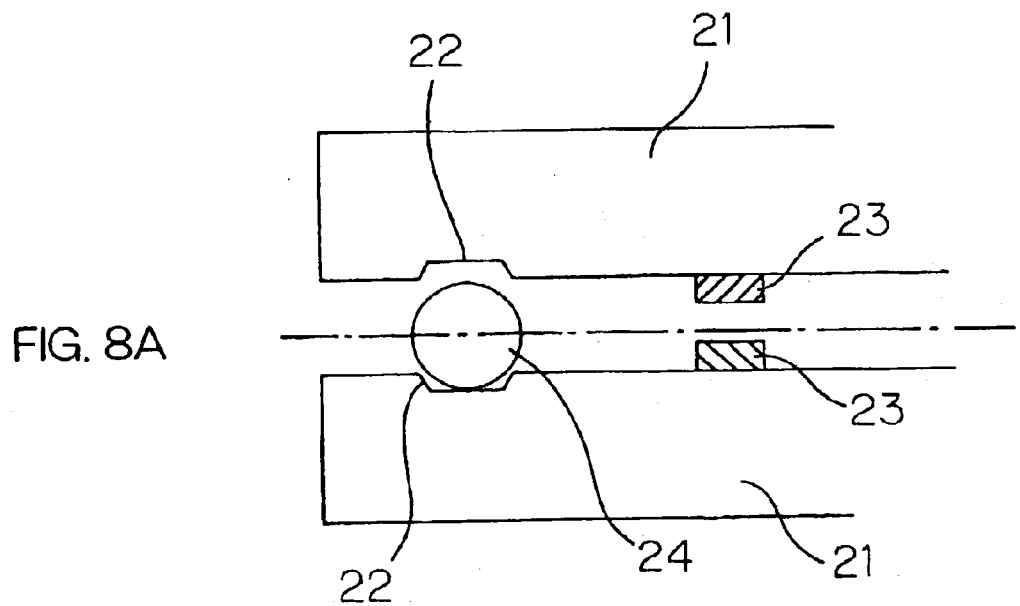
FIGS. 8A and 8B are sectional views for explaining how semiconductor chips are stacked.
Figure 8B:
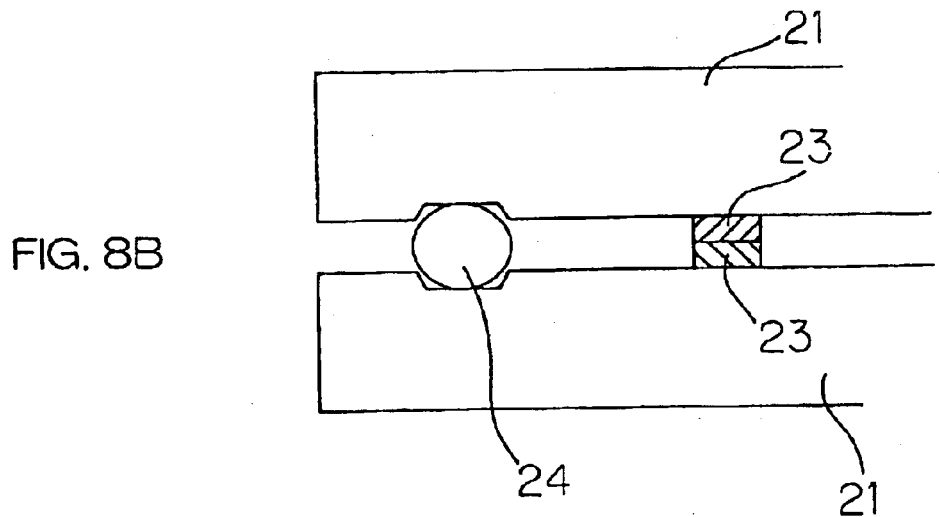
Figure 9:
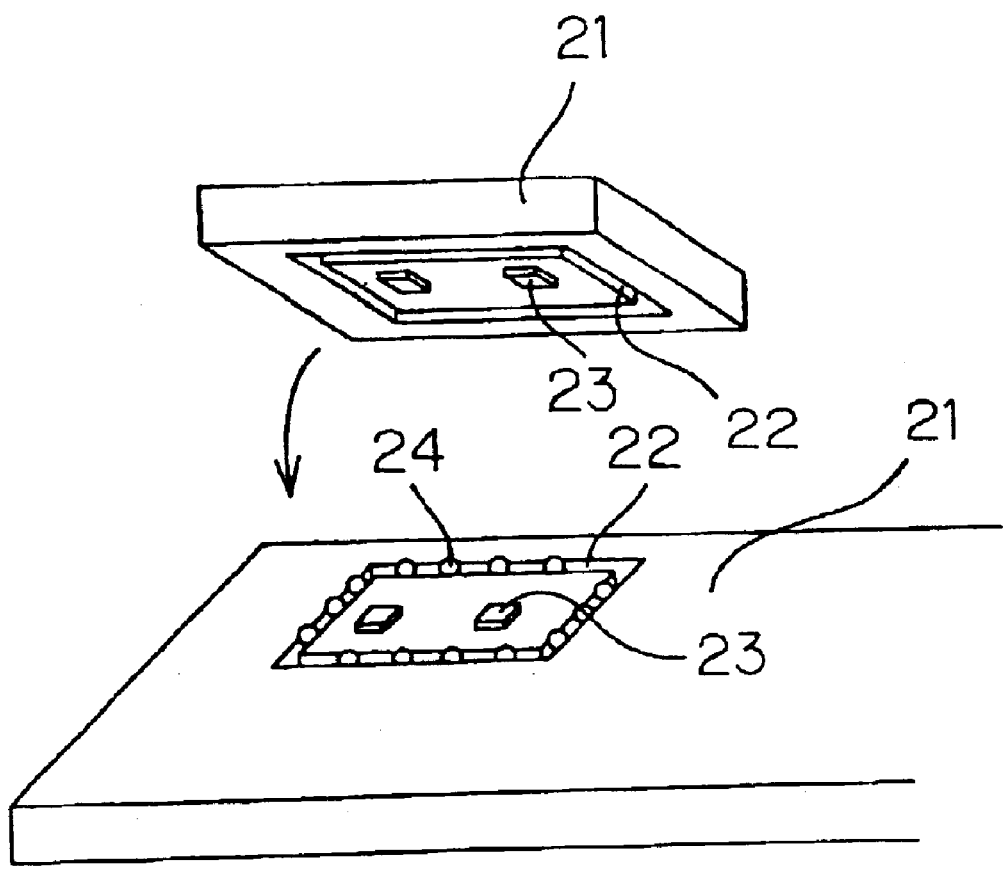
FIG. 9 is a perspective view illustrating a state where the semiconductor chips are to be stacked.

FIG. 8A is a sectional view illustrating a state before another semiconductor chip 21 is stacked on the semiconductor chip 21 provided with the metal balls, and FIG. 8B is a sectional view illustrating a state after the stacking. Further, FIG. 9 is a perspective view illustrating a state where the semiconductor chips are to be stacked. In FIGS. 8A, 8B and 9, the pair of semiconductor chips to be stacked are denoted by the same reference character. These semiconductor chips have similar subsurface structures, but it is not intended that the semiconductor chips have the same internal construction and function.

As shown in FIG. 8A, the metal balls 24 each have a radius such that the center thereof is located at a higher level than the top surface of the bump 23 when the metal balls 24 are placed in the groove. In practice, the metal balls 24 have a radius of about 10 ìm.

A groove 22 is also formed in a predetermined position within a peripheral surface portion of the other semiconductor chip 21. When the chips are stacked, the grooves 22, 22 are guided by the metal balls 24 thereby to be located in the same position as viewed in plan. When the semiconductor chips 21 are pressed against each other in this state (see FIG. 9), the semiconductor chips 21 are properly positioned with each other with the metal balls 24 being held between the grooves 22 and 22. Thus, the bumps 23, 23 can assuredly be bonded to each other with the semiconductor chips 21, 21 being properly positioned with respect to each other as shown in FIG. 8A.

The metal balls 24 are deformed to be crushed by press-bonding, thereby alleviating a shock exerted on the bumps 23 at the bonding. During use of a semiconductor device of chip-on-chip structure constituted by the semiconductor chips 21, 21, the metal balls serve to absorb stresses exerted on the joint portions of the semiconductor chips due to warpage of semiconductor substrates of the semiconductor chips.

Figure 10A:
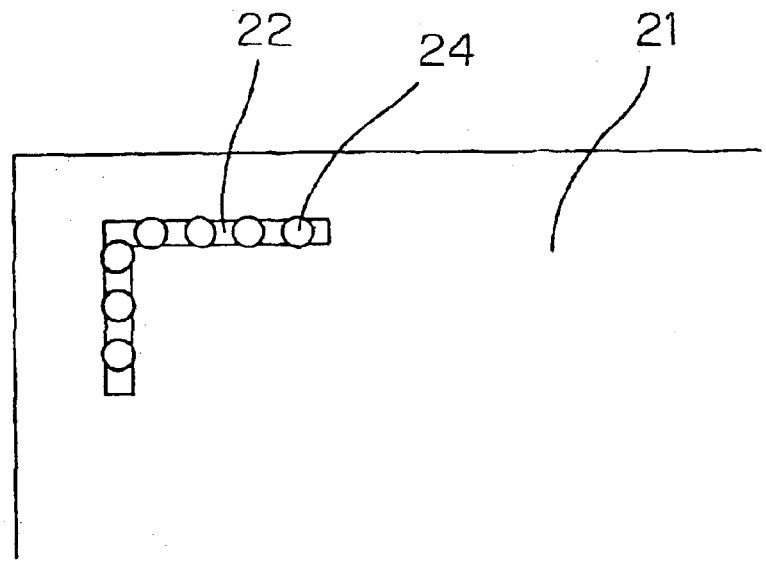
FIG. 10A is a plan view illustrating one exemplary structure in which a single groove is formed in part of a peripheral portion of the semiconductor chip.
Figure 10B:
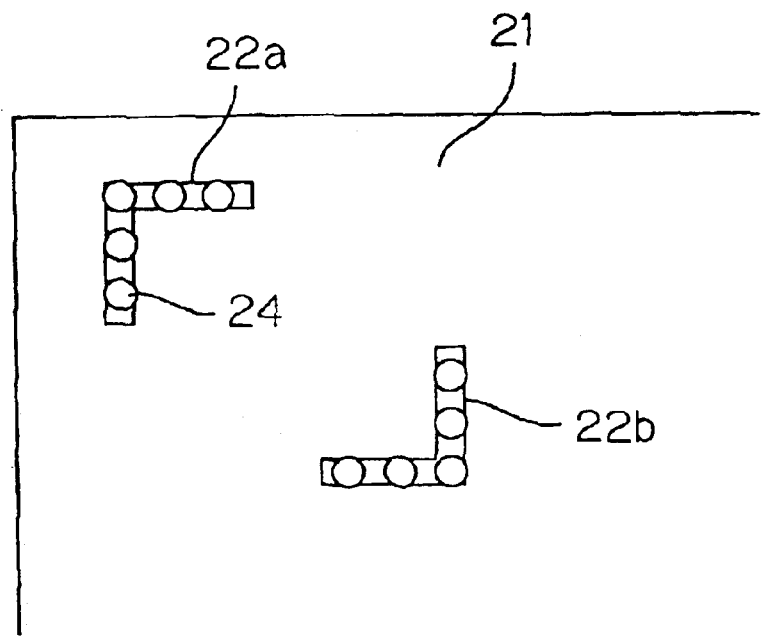
FIG. 10B is a plan view illustrating another exemplary structure in which a plurality of grooves are formed in a peripheral portion of the semiconductor chip.

The grooves 22 are not necessarily each formed along the entire periphery of the semiconductor chip, but may be formed along a part of the periphery of the semiconductor chip as shown in FIG. 10A. Alternatively, a plurality of grooves may be formed in the peripheral portion of each of the semiconductor chips as shown in FIG. 10B. What is important is to ensure accurate positioning of the semiconductor chips with respect to each other.

Figure 11A:
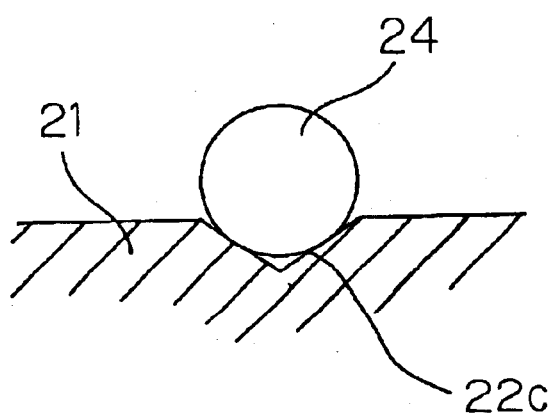
FIGS. 11A and 11B are sectional views illustrating groove configurations.
Figure 11B:
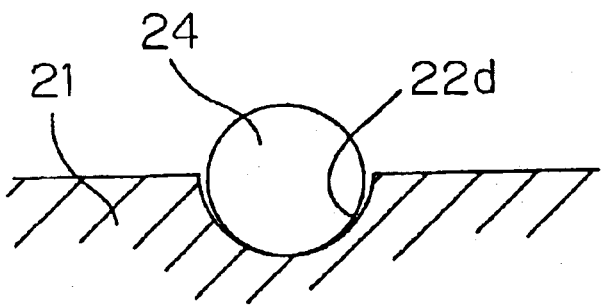

The grooves 22 may each have any shape. For example, a groove 22c having a V-shaped cross section may be formed as shown in FIG. 11A, or a groove 22d having a semicircular cross section may be formed as shown in FIG. 11B.

Figure 12:
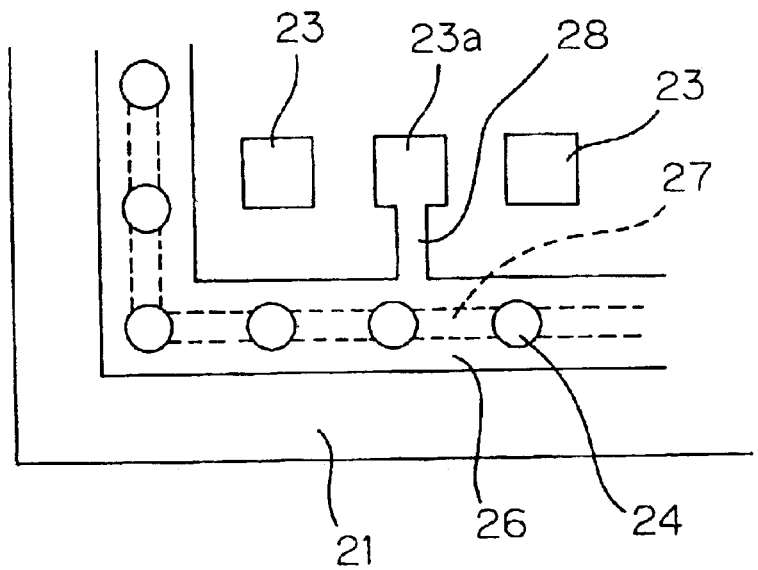
FIG. 12 is a plan view illustrating the construction of a semiconductor chip constituting a semiconductor device according to a fourth embodiment of the invention.

FIG. 12 is a plan view illustrating a semiconductor chip 21 in accordance with a fourth embodiment of the invention in which a bump is provided in a predetermined position within a peripheral portion thereof and a groove is formed in the bump. In FIG. 12, components corresponding to those illustrated in FIGS. 7A, 7B and the like are denoted by the same reference characters as in FIGS. 7A, 7B and the like. However, it is not intended that the components denoted by the same reference character necessarily have an identical construction.

An elongated bump 26 (hereinafter referred to as "peripheral bump 26") is provided in a peripheral portion surrounding a device formation region on an active surface side of the semiconductor chip 21. The peripheral bump 26 is formed with a groove 27, in which metal balls 24 are disposed. The peripheral bump 26 may function as an electrode. In FIG. 12, for example, the peripheral bump 26 is connected to an electrode bump 23a via a bridging bump 28, so that the peripheral bump 26 can be employed as a ground line or a power supply line.

Figure 13:
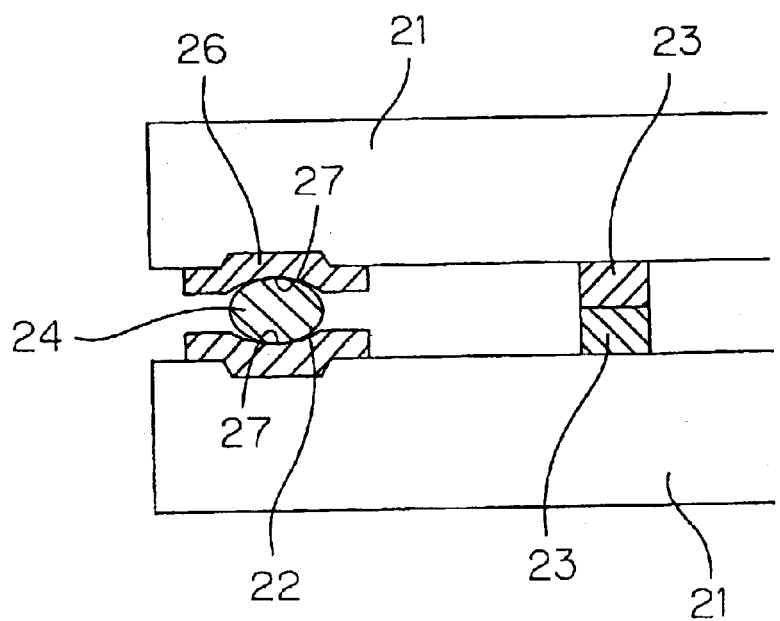
FIG. 13 is a sectional view illustrating a state where semiconductor chips each formed with a peripheral bump are bonded to each other.

FIG. 13 is a sectional view illustrating a state where the semiconductor chips 21, 21 each formed with the peripheral bump 26 are bonded to each other. The semiconductor chips 21, 21 bonded to each other have similar subsurface structures, but not necessarily have the same internal construction and function.

The semiconductor chips 21, 21 can properly be positioned with respect to each other with the grooves 27, 27 being registered by the metal balls 24, so that the bumps 23, 23 can assuredly be bonded to each other.

The peripheral bumps 26 and the metal balls 24 are deformed by a pressure applied thereto at the bonding, thereby alleviating a shock applied to the bumps 23. During use of a semiconductor device of chip-on-chip structure constituted by the semiconductor chips 21, 21 bonded to each other, the metal balls 24 serve to absorb stresses exerted on the joint portions of the semiconductor chips due to warpage of semiconductor substrates of the semiconductor chips.

Where the peripheral bumps 26 are used as electrodes, electrical connection between the peripheral bums 26 of the upper and lower semiconductor chips 21, 21 can be established by the metal balls 24.

FIGS. 14A to 14E are diagrams for explaining a process for forming a peripheral bump 26 having a groove 27.

Figure 14A:
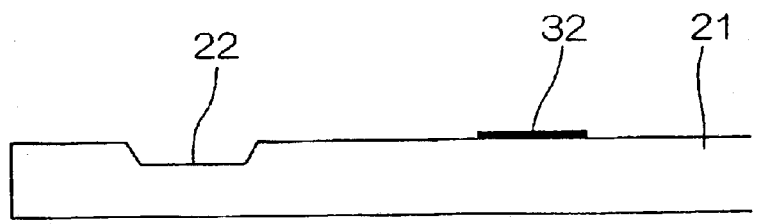
FIGS. 14A to 14E are diagrams for explaining a process for forming a grooved peripheral bump.

FIG. 14A illustrates a state where the groove 22 is formed in a predetermined position of the substrate of the semiconductor chip 21 as extending perpendicularly to the paper face. The formation of the groove 22 may be achieved by partial etching, mechanical cutting or the like. A reference numeral 32 denotes an Al pad electrode (an exposed portion of an internal interconnection).

Figure 14B:
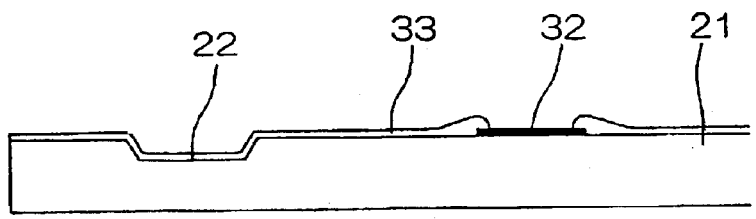

A passivation film 33 such as of SiN, SiON, $SiO_2$ or PSG is formed on the entire surface of the substrate (FIG. 14B). The formation of the passivation film 33 is achieved, for example, by plasma CVD.

Figure 14C:
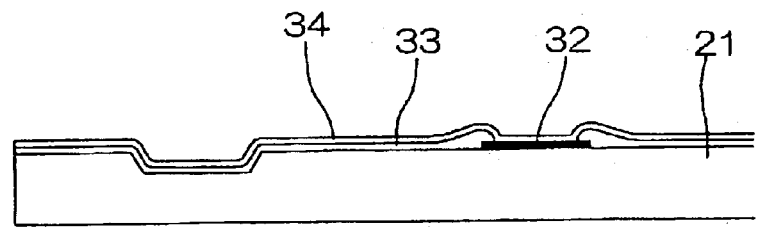

As shown in FIG. 14C, a TiW alloy layer (barrier metal layer) for improving adhesion to the underlying layer and a seed layer 34 such as of Au or Pt for power supply for plating are successively formed on the entire surface of the resulting substrate by vapor deposition such as sputtering.

Figure 14D:
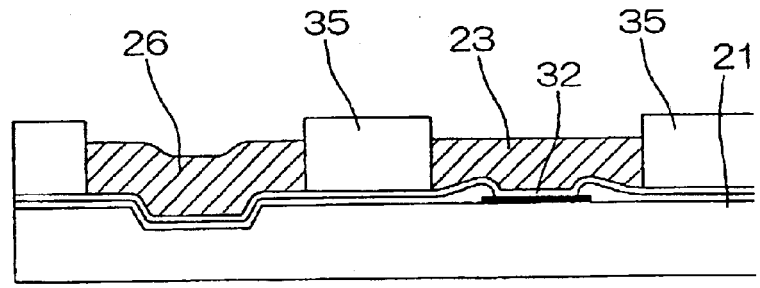

In turn, a photoresist 35 is applied on the resulting surface except portions thereof which are to be subjected to plating for bump formation, and then a metal bump material is thickly deposited on the portions by an electroplating method (FIG. 14D). Examples of the metal bump material include oxidation-resistant metals such as Au, Pd, Pt, Ag and Ir (iridium). Instead of the electroplating method, an electroless plating method may be employed which is a metal film formation method utilizing a reducing action by a chemical reaction. In this case, the peripheral bump thus formed by plating has a height such that the topmost surface thereof is located at a lower level than the center of a metal ball 24 placed thereon.

Figure 14E:
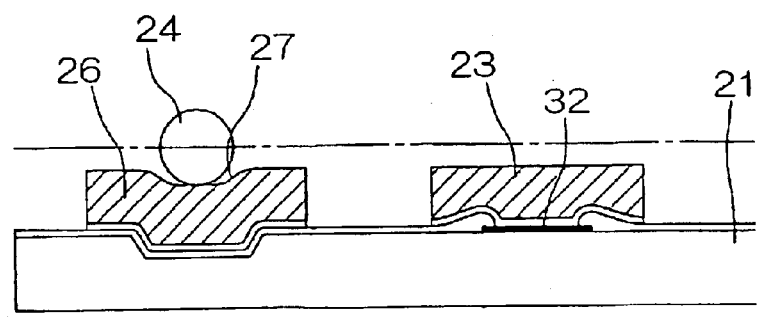

In turn, the photoresist 35 is removed, and the barrier metal layer and the seed layer 34 on the resulting surface are removed. Then, the resulting surface is subjected to an annealing process. Thus, the semiconductor chip formed with the bump 23 and the peripheral bump 26 is provided. The peripheral bump has a depression having a depth corresponding to the depth of the groove 22 formed in the substrate. This depression serves as the groove 27 extending along the peripheral bump. Metal balls 24 are placed on the groove 27 (FIG. 14E).

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application claims priority benefits under 35 USC section 119 on the basis of Japanese Patent Applications No. 11-46853 and No. 11-51210 filed to the Japanese Patent Office on Feb. 24, 1999 and on Feb. 26, 1999, respectively, the disclosure thereof being incorporated herein by reference.

What is claimed is:

1. A semiconductor device comprising:
    a first semiconductor chip;
    a second semiconductor chip bonded to the first semiconductor chip in a stacked relation; and
    a registration structure which causes the first and second semiconductor chips to be positioned with respect to each other with use of a depression-projection engagement,
    wherein the registration structure includes:
        a registration recess provided on a surface of the first semiconductor chip opposed to the second semiconductor chip, and
        a registration projection provided on a surface of the second semiconductor chip opposed to the first semiconductor chip for engagement with the registration recess,
    wherein the registration projection is a spherical member provided on the surface of the second semiconductor chip,
    wherein the second semiconductor chip has a bump for electrical connection to the first semiconductor chip,
    wherein the spherical member has a radius such that a distance between a center thereof and the surface of the second semiconductor chip is greater than a height of the bump as measured from the surface of the second semiconductor chip,
    wherein, in a registration state, the registration projection is received by the registration recess and the registration structure inhibits relative movement between the first and second semiconductor chips in any direction along the surfaces of the semiconductor chips in a pre-mounted state where the bumps are disposed apart from one another, and
    wherein the registration projection is deformed into a non-spherical shape in a mounted state where the bumps contact one another.

2. A semiconductor device as set forth in claim 1, wherein the recess is a pad provided on the first semiconductor chip.

3. A semiconductor device as set forth in claim 1, wherein the recess is a recess formed in a semiconductor substrate which serves as a base of the first semiconductor chip.

4. A semiconductor device as set forth in claim 1, wherein the recess is a recess formed in an insulating film provided on a semiconductor substrate which serves as a base of the first semiconductor chip.

5. A semiconductor device as set forth in claim 1, wherein the registration recess is formed in a first bump provided on the surface of the first semiconductor chip, and wherein the registration projection is a second bump provided on the surface of the second semiconductor chip.

6. A semiconductor device, comprising:
    a first semiconductor chip;
    a second semiconductor chip bonded to the first semiconductor chip in a stacked relation; and
    a registration structure which causes the first and second semiconductor chips to be positioned with respect to each other with use of a depression-projection engagement, wherein the registration structure includes:
        a first registration recess provided on a surface of the first semiconductor chip opposed to the second semiconductor chip;
        a second registration recess provided on a surface of the second semiconductor chip opposed to the first semiconductor chip; and
        a spherical member received between the first end second registration recesses in a pre-mounted state where the first and second semiconductor chips are not fixedly connected to each other, the spherical member deforming into a non-spherical shape in a mounted state where the first and second semiconductor chips are fixedly connected to each other.

7. A semiconductor device as set forth in claim 6, wherein both or either of the first registration recess and the second registration recess is a groove.

8. A semiconductor device as set forth in claim 7, wherein the groove is a groove formed in a peripheral region surrounding a device formation region.

9. A semiconductor device as set forth in claim 8, wherein the groove is a continuous groove entirely surrounding the device formation region.

10. A semiconductor device as set forth in claim 8, wherein the groove includes a plurality of discontinuous grooves.

11. A semiconductor device as set forth in claim 8, wherein the peripheral region is a scribe line region.

12. A semiconductor device as set forth in claim 8, wherein the first or second semiconductor chip has a peripheral bump surrounding the device formation region thereof and the groove is a groove formed in the peripheral bump.

13. A semiconductor device as set forth in claim 6, wherein the first or second semiconductor chip has a bump for electrical connection therebetween, and wherein the spherical member has a radius such that a center thereof is located at a higher level than a top surface of the bump when the spherical member is placed in the first or second registration recess before assembling.

14. A semiconductor chip, which is to be bonded to a surface of a solid body, the semiconductor chip comprising:

a projection in the firm of a spherical member, provided on a surface thereof for positioning thereof with respect to the surface of the solid body, and a bump for electrical connection to the solid body, wherein, the spherical member has a radius such that a distance between a center thereof and the surface of the semiconductor chip is greater than a height of the bump as measured from the surface of the semiconductor chip such that when the semiconductor chip and the solid body or connected together, the spherical member deforms into a non-spherical shape.

15. A semiconductor device comprising: a first semiconductor chip;

a second semiconductor chip bonded to the first semiconductor chip in a stacked relation; and a first bump formed on a surface of the first semiconductor chip, wherein the first and second bumps respectively have mating surfaces to be bonded to each other, and the mating surfaces of the first and second bumps having different areas, wherein the mating surface of the first bump is of a concave shape and has a greater area than the mating surface of the second bump, and wherein the mating surface of the second bump is of a convex shape.

16. A semiconductor device, comprising:

a first semiconductor chip:

a second semiconductor chip bonded to the first semiconductor chip in a stacked relation; and a first bump formed on a surface of the first semiconductor chip;

wherein the first and second bumps respectively have mating surfaces to be bonded to each other, and the mating surfaces of the first and second bumps having different areas, wherein the mating surface of the first bump is of a convex shape and has a greater area than the mating surface of the second bump, and wherein the mating surface of the second bump is of a concave shape.

* * * * *